United States Patent [19]

Hayden

[11] Patent Number: 5,498,889
[45] Date of Patent: Mar. 12, 1996

[54] SEMICONDUCTOR DEVICE HAVING INCREASED CAPACITANCE AND METHOD FOR MAKING THE SAME

[75] Inventor: James D. Hayden, Austin, Tex.

[73] Assignee: Motorola, Inc., Schaumburg, Ill.

[21] Appl. No.: 353,737

[22] Filed: Dec. 12, 1994

Related U.S. Application Data

[63] Continuation of Ser. No. 158,552, Nov. 29, 1993, abandoned.

[51] Int. Cl.⁶ .................... H01L 27/108; H01L 29/76; H01L 29/94; H01L 31/119
[52] U.S. Cl. .................. 257/301; 257/296; 257/300; 257/306; 257/379
[58] Field of Search .................... 257/303, 296, 257/297, 300, 301, 306, 309, 379, 532, 534, 535, 900, 903, 347, 350, 352, 353, 329; 437/21, 41

[56] References Cited

U.S. PATENT DOCUMENTS

| | | | |
|---|---|---|---|
| 4,845,539 | 7/1989 | Inoue | 257/303 |
| 5,158,898 | 10/1992 | Hayden et al. | 437/21 |
| 5,229,310 | 7/1993 | Sivan | 437/41 |
| 5,235,189 | 8/1993 | Hayden et al. | 257/329 |

FOREIGN PATENT DOCUMENTS 2-199871  8/1990  Japan ..................... 257/301

*Primary Examiner*—Steven H. Loke
*Attorney, Agent, or Firm*—Patricia S. Goddard

[57] ABSTRACT

A semiconductor device (10) has a capacitor structure formed within an opening (30) of a stack of a dielectric layer (24), a conductive layer (26), and a dielectric layer (28). A first capacitor electrode is formed by conductive sidewall spacers (32) which are in electrical contact with conductive layer (26) along sidewalls of the opening. A capacitor dielectric (34) is formed on the sidewall spacers. A second capacitor electrode is formed by a conductive layer (38), either alone or in conjunction with a second set of conductive sidewall spacers (36). In one embodiment, the capacitor is formed over a gate electrode (15) of a bulk transistor and makes contact thereto. The capacitor structure is particularly suited for use in an SRAM cell.

10 Claims, 3 Drawing Sheets

SEMICONDUCTOR DEVICE HAVING INCREASED CAPACITANCE AND METHOD FOR MAKING THE SAME

This application is a continuation of prior application Ser. No. 08/158,552, filed Nov. 29, 1993, now abandoned.

CROSS-REFERENCE TO A RELATED APPLICATION

The present invention is related to the following commonly assigned, co-pending patent applications:
1. "Thin-Film Transistor With Fully Gated Channel Region and Method for Making the Same," by James D. Hayden, Ser. No. 08/158,560, filed Nov. 29, 1994.
2. "Static Random Access Memory Cell and a Method of Making the Same," by Yasunobu Kosa et al., Ser. No. 07/989,425, filed Dec. 11, 1992.

FIELD OF THE INVENTION

The present invention relates to semiconductor devices generally, and more specifically to semiconductor devices having capacitor structures, such as random access memories, and methods for making the same.

BACKGROUND OF THE INVENTION

Within integrated circuits, semiconductor devices such as memory cells and their components are becoming smaller. In a static random access memories (SRAMs), decreased cell size often enhances device performance. For example, as the size of a SRAM cell decreases the operational speed of the SRAM typically increases while the power consumption typically decreases. However, small SRAM cells likewise have some drawbacks. One such drawback is related to a decrease in storage node capacitance. The amount of charge at a storage node is about the product of the capacitance of the storage node and the voltage difference between the plates of the storage node capacitor. Smaller SRAM cells typically have less capacitance because the area of the storage node capacitor typically decreases with the SRAM cell size. The decrease in capacitance may allow alpha particles to cause soft errors.

Incorporating additional capacitors within a SRAM cell is one way to increase the storage node capacitance, which typically reduces the soft error rate of the SRAM cell. Capacitors that are connected to the storage nodes are discussed in many patents and technical articles. A dynamic-random-access memory (DRAM) typically has a storage capacitor such as a fin capacitor. Many DRAM storage capacitors including fin capacitors are complex and would require many additional processing steps to an existing SRAM process. In another attempt to reduce soft error rates, an SRAM cell may have its storage nodes capacitively coupled to a relatively constant voltage supply such as Vss or Vdd. One problem with coupling the storage nodes to these constant voltage supplies is that additional conductive layers are often required, making processing more complex and restricting use of the cell area for other circuitry. Accordingly, there is a need to increase capacitance of memory storage nodes to decrease soft error rates while at the same time keeping cell size and process complexity to a minimum.

SUMMARY OF THE INVENTION

In one form, the present invention is a semiconductor device having a semiconductor substrate with an overlying stack of a first dielectric layer, a first conductive layer, and a second dielectric layer. An opening, having sidewalls and a bottom, extends through the first dielectric layer, the first conductive layer, and the second dielectric layer. Conductive spacers are formed along the sidewalls of the opening and in electric contact with the first conductive layer. A third dielectric layer covers the conductive spacers within the opening. A second conductive layer is adjacent the third dielectric layer and substantially fills the opening. In another form of the invention, a method for making such a device is provided.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF THE PREFERRED EMBODIMENT

The present invention overcomes many of the disadvantages of a small SRAM bitcell by incorporating a storage capacitor which increases the total storage node capacitance and improves the soft error rate of an SRAM memory. In one embodiment, conductive spacers formed along the sidewalls of an opening in a dielectric layer and in electrical contact with a first conductive layer, which is connected to Vss, form the first plate of the capacitor while a second conductive layer forms the second plate. The two capacitor plates are separated by a thin dielectric layer. In this fashion, the total storage node capacitance of the SRAM bitcell can be increased substantially. In one application, the bottom of the opening is formed from the gate of a metal-oxide-semiconductor field effect transistor (MOSFET) fabricated in the underlying silicon substrate. In this case, the second capacitor plate also serves as an electrical connection between the underlying MOSFET gate electrode and an overlying, subsequent conductive layer, such as the gate or channel region of a thin film polysilicon transistor (TFT). In the most general form, the opening in a dielectric layer can be formed without an underlying MOSFET gate or semiconductor substrate.

Figure 1:
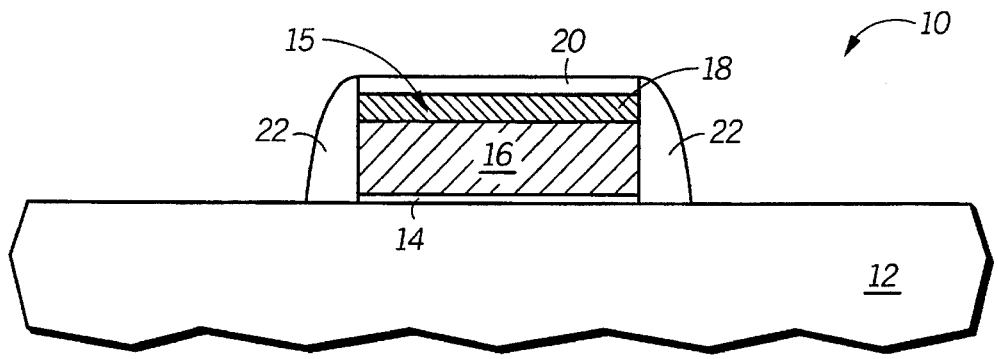
FIGS. 1–6 illustrate, in cross-sectional views, sequential process steps suitable for making a semiconductor device in accordance with one embodiment of the present invention.

FIG. 1 illustrates, in cross-section, a portion of a suitable semiconductor device 10 within which a storage capacitor can be built in accordance with the present invention, although other structures are also suitable. In one embodiment of the invention, device 10 is a portion of an SRAM cell in an integrated circuit. Other applications may include a DRAM cell or a capacitor in another integrated circuit application requiring small packing density. Device 10 includes a semiconductor substrate 12 which is preferably a semiconducting wafer of, for instance, silicon; although gallium arsenide (GaAs), or silicon on insulator (SOI), etc. could also be used. Substrate 12, however, may be any layer of semiconductor device, including either an insulating layer or a conductive layer. A gate dielectric 14, such as an oxide, a nitride, or an oxynitride combination, overlies substrate 12. Above gate dielectric 14 is a gate electrode 15 which includes a polysilicon layer 16 and an overlying silicide layer 18. A dielectric layer 20 lies above silicide layer 18. Dielectric layer 20, as will become evident later, serves as an etchstop layer, and may be of, for example, silicon nitride. It should be noted that the silicide layer 18 and dielectric layer 20 are not essential components of the invention. Gate electrode 15 is a gate for a bulk MOSFET transistor fully present in another portion of device 10. A bulk transistor is one in which current electrodes (source and drain electrodes) are formed in the bulk of a semiconductor substrate, rather than in overlying layers such as in TFT structures. For purposes of understanding the present invention, the bulk transistor for gate electrode 15 is not necessary and therefore is not fully illustrated or described. Dielectric sidewall spacers 22 are formed adjacent gate electrode 15. The structure of device 10 as illustrated in FIG. 1 is formed using conventional complementary metal-oxide semiconductor (CMOS) processing technology which is readily understood by those having ordinary skill in the art of CMOS semiconductor processing. Accordingly, further discussion on how the structure illustrated in FIG. 1 is formed is not necessary.

Figure 2:
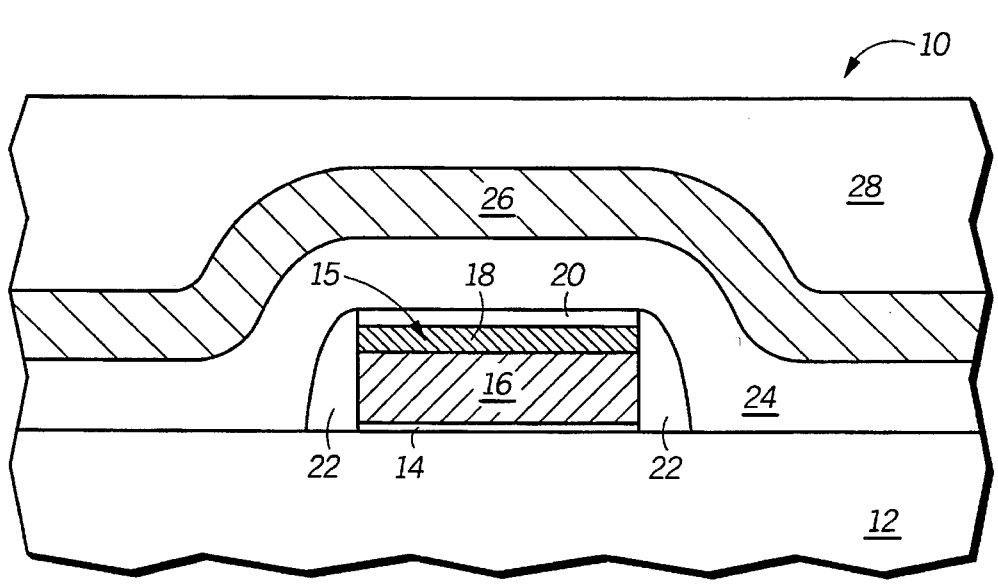

As illustrated in FIG. 2, and in accordance with one embodiment of the present invention, a dielectric layer 24 is deposited over device 10. Dielectric layer 24 may be $SiO_2$, phospho-silicate glass (PSG), boron-doped PSG (BPSG), tetra-ethyl-ortho-silicate (TEOS), spin-on-glass (SOG), or other dielectric material used in semiconductor fabrication. Preferably, dielectric layer 24 has the ability to be etch selectively to underlying dielectric layer 20. After depositing layer 24, a first conductive layer 26 is next deposited over device 10. Conductive layer 26 may be composed of polysilicon, tungsten polycide, titanium salicide, titanium nitride, or any combined stack of these or similar materials. Dielectric layer 28 is next deposited over device 10. Dielectric layer 28 may be planarized to give a substantially smooth surface to facilitate subsequent processing. Dielectric layer 28 may also be $SiO_2$, PSG, BPSG, TEOS, SOG, or the like. If either dielectric layer 24 or 28 is comprised of a doped glass, it is important to compensate for the effects of the dopant on subsequently deposited conductive layers in the structure.

Figure 3:
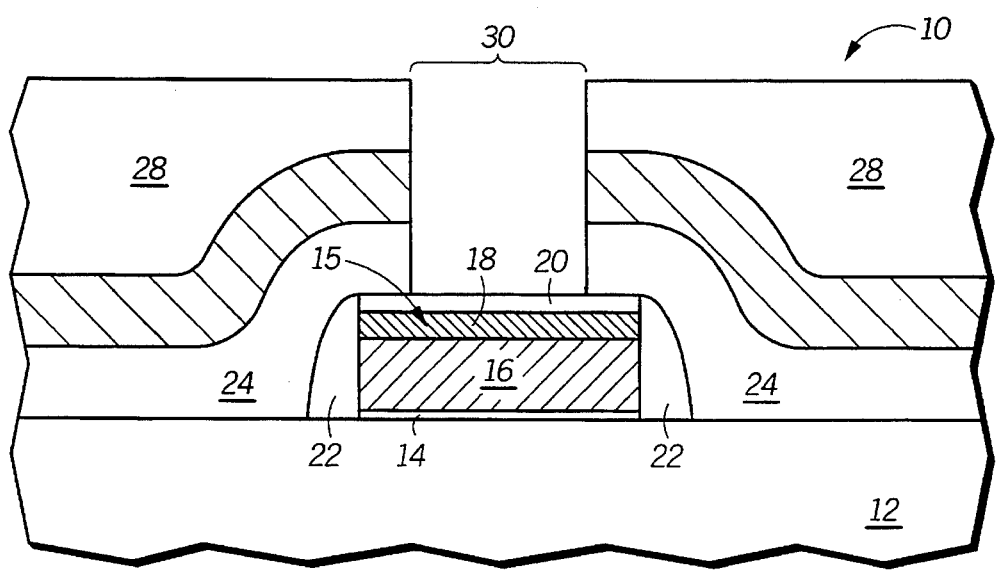

An opening 30 is formed in layers 28, 26, and 24, stopping on dielectric layer 20 so as not expose underlying gate electrode 15, as is shown in FIG. 3. This opening is formed using conventional lithographic and etching techniques, such as using a photoresist mask in conjunction with an anisotropic etch. Etch chemistries during an anisotropic etch may be changed as needed during the etch in order to remove the particular layer exposed. Opening 30 has sidewalls defined by dielectric layers 28 and 24 and first conductive layer 26, and a bottom defined by dielectric layer 20 overlying gate electrode 15. The sidewalls of opening 30 are substantially vertical and the exposed portion of first conductive layer 26 is largely without any native oxide layer. It is useful to note that the capacitor can be formed in accordance with the present invention without an underlying gate electrode or even without an underlying substrate. A dielectric material having an opening formed therein is sufficient to make a storage capacitor in accordance with the invention. If gate electrode 15 is omitted, the bottom of the opening may be defined by underlying substrate 12. Furthermore, the bottom of opening 30 may be defined by dielectric layer 24 by terminating any etch used to form the opening before reaching any underlying layers. The final portion of the etch used to create opening 30 should have selectivity, or a slower etch rate relative to dielectric layer 20 in order to prevent exposing underlying gate electrode 15. In some alternate embodiments, the dielectric layer which serves as an etchstop layer may in some instances also function as an anti- reflection coating (ARC) layer for improving lithographic margins. Also, as discussed later, an additional etchstop layer formed from a conductive material can also provide advantages to the structure, as described below.

Figure 4:
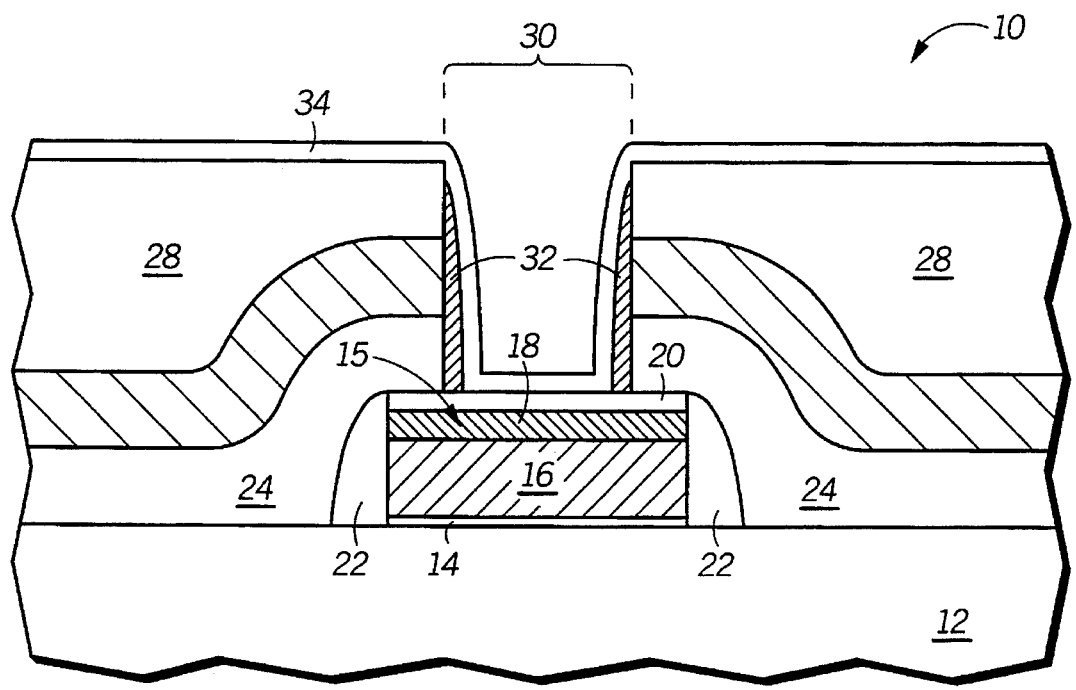

As illustrated in FIG. 4, conductive spacers 32 are formed along the sidewalls of opening 30 and are in electrical contact with first conductive layer 30. Conductive spacers 32 are formed in a conventional fashion using a conformal deposition of a conductive material followed by an anisotropic etching step. These conductive spacers can be formed of polysilicon, amorphous silicon, tungsten polycide, titanium nitride, or any material commonly used in the integrated circuit industry which can be deposited conformally and anisotropically etched. Formation of sidewalls spacers in this fashion requires no additional lithographic patterning steps. Conductive spacers 32 form the first plate of the cell capacitor and are connected electrically to a constant voltage supply in the SRAM cell such as Vss. In order to maximize the area of the capacitor formed in opening 30, and to ensure subsequent layers can be deposited in opening 30, spacers 32 should be as thin as is reasonably possible. For instance, spacers 32 are less than 1000 Å (100 nm) and are preferably less than 500 Å (50 nm). The capacitance of the storage capacitor formed in opening 30 is made as large as possible also by making use of the vertical topography of opening 30. A capacitor dielectric 34 is formed over conductive spacers 32 and dielectric layer 28. Capacitor dielectric 34 may be either thermally grown, in which case it will only cover conductive sidewall spacers 32, or may be deposited, in which case it will cover both conductive spacers 32 and dielectric layer 28, as is illustrated in FIG. 4. Suitable materials for capacitor dielectric 34 include conventional gate dielectric materials, such as silicon dioxide, $SiO_2$, silicon nitride, $Si_3N_4$, or a combination of these. Capacitor dielectric 34 should be kept as thin as reliably and manufacturably possible in order to achieve the maximum increase in cell capacitance.

Figure 5:
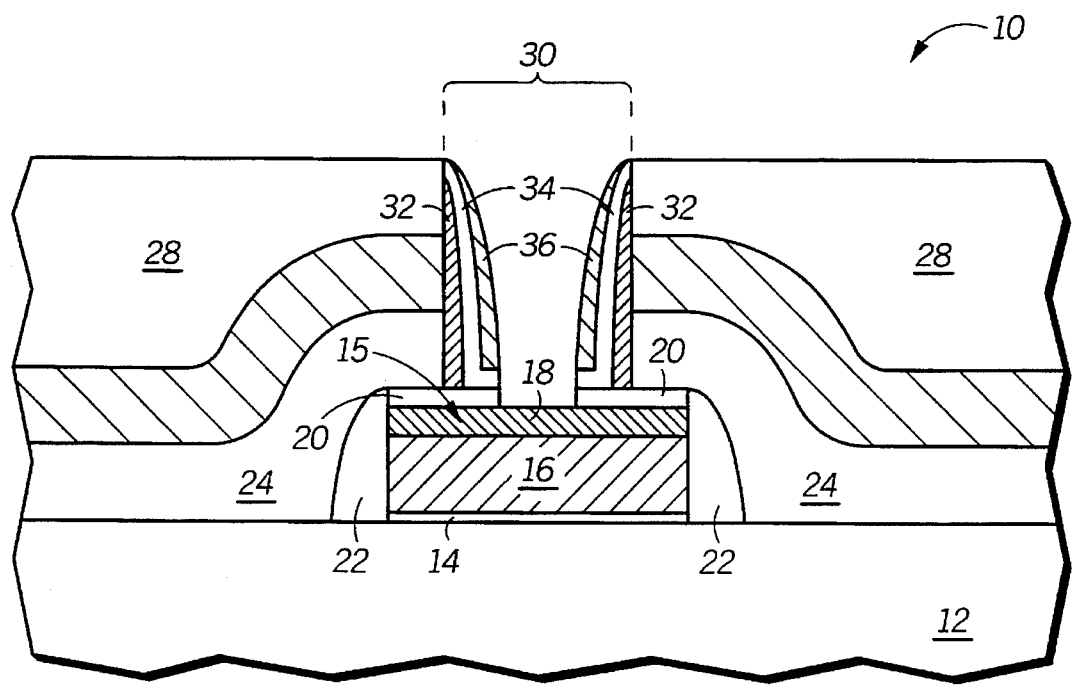

Next, a second set of conductive sidewall spacers 36 is formed in opening 30, using conventional deposition and etching techniques, as illustrated in FIG. 5. These spacers may be formed of polysilicon, tungsten polycide, titanium nitride, or any other material commonly used in integrated circuit processing which can be deposited-conformally and etched anisotropically. After forming spacers 36, capacitor dielectric layer 34 and dielectric layer 20 are etched anisotropically where not covered by second set of sidewall spacers 36. This exposes the underlying MOSFET gate electrode 15 and will allow electrical contact to be formed between a subsequently deposited conductive layer (which will form the second capacitor plate) and the MOSFET gate. If there is no underlying MOSFET gate or substrate to be contacted, the second set of sidewall spacers 36 and the subsequent opening in capacitor dielectric 34 are not required. The second set of sidewall spacers 36 is used to prevent shorting between the first set of sidewall spacers which form the first plate of the storage capacitor and a second conductive layer which is subsequently deposited. During the etching of capacitor dielectric 34, it is important that underlying conductive spacers 32 not become exposed, otherwise the second conductive layer will be electrically shorted to spacers 32. Similarly, if capacitor dielectric 34 is grown, it is important that spacers 32 be fully covered by the dielectric.

Figure 6:
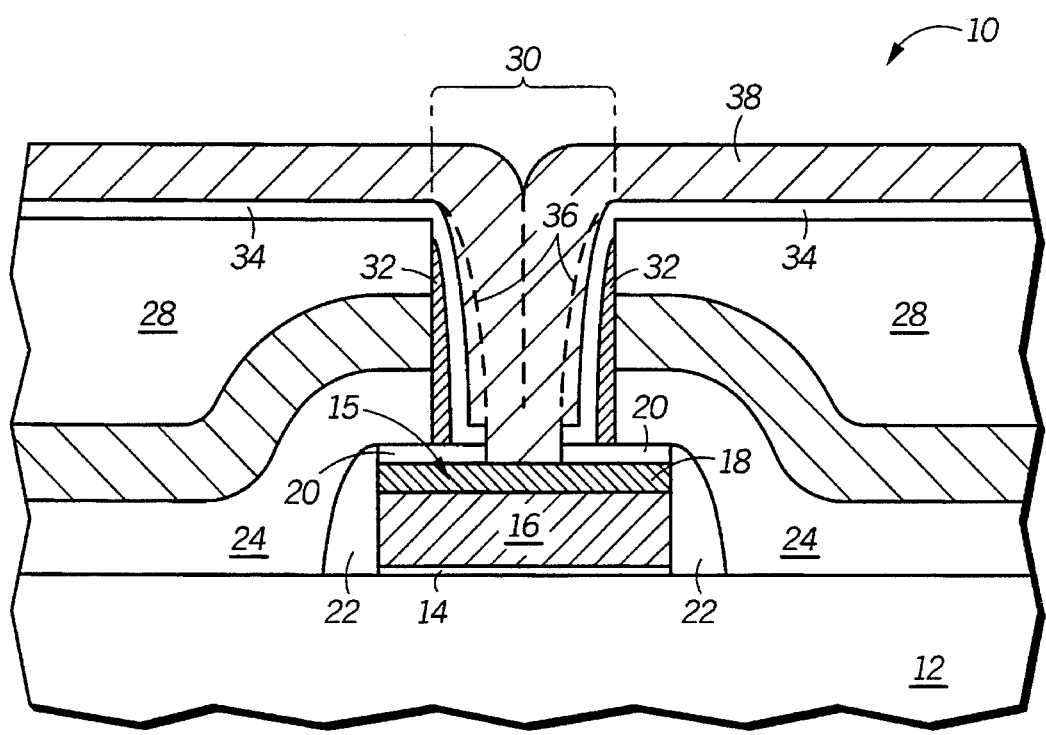

As illustrated in FIG. 6, a second conductive layer 38 is deposited over the second set of sidewall spacers 36 and capacitor dielectric 34 which overlies dielectric layer 28, or immediately overlying dielectric layer 28 in the case of a grown capacitor dielectric layer. Second conductive layer 38 substantially fills opening 30 and together with second sidewall spacers 36 completes the second plate of the added capacitor. Layer 38 can be formed from polysilicon, amorphous silicon, tungsten polycide, titanium nitride, or any other commonly used material. Second conductive layer 38 is subsequently patterned and etched using conventional lithographic and etching techniques to form a desired conductor pattern on dielectric layer 28. For example, second conductive layer 38 may be patterned to form a portion of a TFT gate or channel structure and a connection to an underlying MOSFET gate. The second plate of the added capacitor can be doped with commonly used techniques in the integrated circuit industry including ion implantation or in-situ doping during deposition.

As is evident from FIG. 6, device 10 includes a storage capacitor built in an opening 30 which can be used to substantially increase the total storage node capacitance of an SRAM cell and improve the soft error rate immunity of an SRAM circuit. The capacitor includes, in its most basic form, a first capacitor plate comprised of first sidewall spacers 32, a capacitor dielectric 34, and a second capacitor plate formed from the second set of sidewall spacers 36 and second conductive layer 38. By placing the added capacitor in an opening 30, use can be made of the vertical topography of an SRAM cell and the area of the cell can continue to be minimized. The bottom of opening 30 can be formed by dielectric layers 24 or 20. Alternatively, a MOSFET gate can form the bottom of opening 30 and the second capacitor plate can also serve as an interconnect between different elements and different vertical planes in the SRAM cell. The second plate of the capacitor can also be continuous with and serve as part of a TFT gate or channel.

Figure 7:
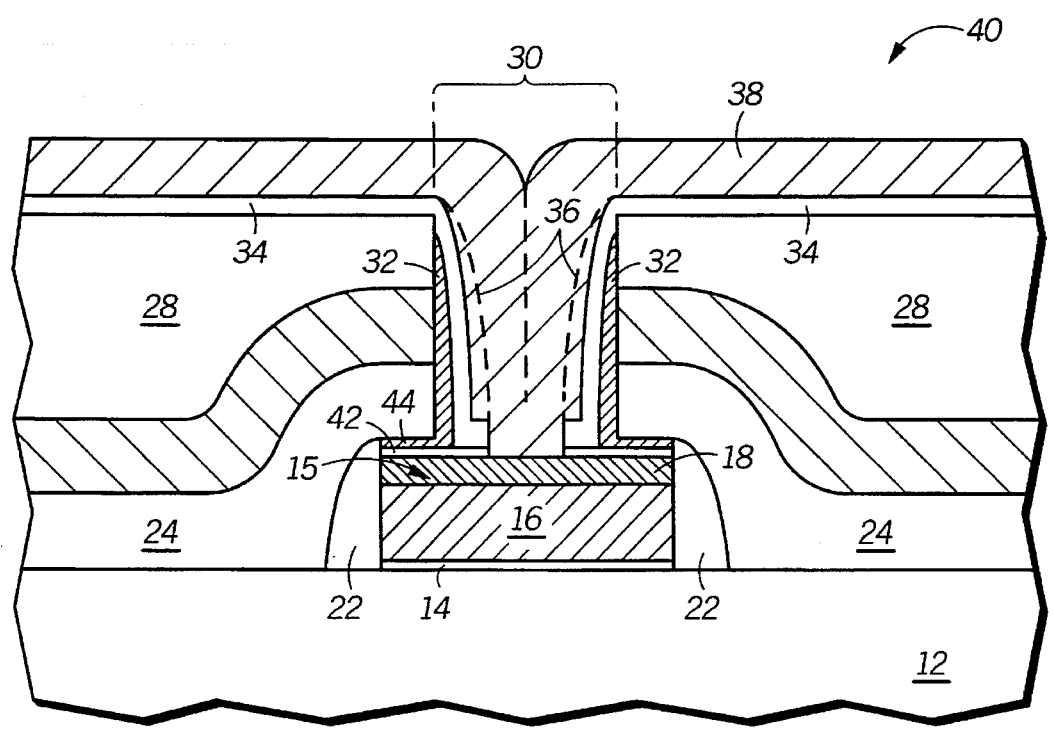
FIG. 7 illustrates, in a cross-sectional view, an alternative embodiment of a semiconductor device in accordance with the present invention.

FIG. 7 illustrates an alternative structure for adding a capacitor to an SRAM cell. In most details, this structure and the process required to form this structure are identical to that described previously in FIG. 6. Since many of the elements already described are also included in the structure in FIG. 7, the same reference numerals are used and corresponding descriptions are omitted. In this alternate structure, a dielectric etchstop layer 42 overlies silicide layer 18 and a conductive etchstop layer 44 overlies layer 42. Dielectric etchstop layer 42 can be formed from silicon dioxide, TEOS, or silicon nitride (in which case, it can also serve as an anti-reflection coating layer). Conductive etchstop layer 44 can be formed from polysilicon, amorphous silicon, tungsten polycide, titanium nitride, or any other conductive material used in semiconductor processing. Both dielectric etchstop layer 42 and conductive etchstop layer 44 initially are formed across the entire upper surface of gate electrode 15.

During the formation of opening 30, conductive layer 44 serves as what is known as an etchstop layer for the etching of dielectric layer 24. The etch rate of conductive layer 44 is considerably smaller relative to that of dielectric layer 24. After opening 30 has been formed with the exposed portion of conductive layer 44 serving as the bottom of the opening, the first set of sidewall spacers 32 are formed as described previously. During the etch required for forming spacers 32, the exposed portion of conductive etchstop layer 44 between the spacers 32 is also removed, thus it may be desirable for conductive etchstop layer 44 and spacers 32 to be of the same material. The spacer etch is then stopped on underlying dielectric etchstop layer 42. After formation of capacitor dielectric 34 and the second set of sidewall spacers 36 as previously described, the portion of dielectric etchstop layer 42 between secondary sidewall spacers 36 is removed in preparation for deposition of second conductive layer 38.

As illustrated in device 40 of FIG. 7, the first set of sidewall spacers 32 are in electrical contact with the conductive etchstop layer 44. Spacers 32 and etchstop layer 44 thus combine together to form the first plate of the storage capacitor while the MOSFET gate 15 and the second conductive layer 38 combine to form the second capacitor plate. The area of the capacitor can thus be substantially increased, further improving the soft error rate immunity of an SRAM circuit. Conductive etchstop layer 44 and capacitor dielectric 34 should be made as thin as is practical from a standpoint of controllability in a manufacturing environment. The capacitance added to the SRAM cell can thus be increased even further.

The foregoing description and illustrations contained herein demonstrate many of the advantages associated with the present invention. In particular, it has been revealed that an additional storage capacitor formed in an SRAM cell in accordance with the present invention overcomes many of the deficiencies associated with a conventional SRAM cell, as described previously. By forming the capacitor in an opening or contact hole and making use of the vertical topography of the SRAM cell structure, the total storage node capacitance of the SRAM cell can be substantially enhanced without requiring an increase in the cell area. The present invention can be easily incorporated into existing memory cell designs and process flows which require an interconnection between cell components created by forming an opening to an underlying MOSFET gate. For example, many existing designs require an interconnect be formed between the bulk MOSFET gate and the gate or channel region of an overlying thin film polysilicon transistor or TFT. The present invention can be used to form a capacitor in such opening, thereby gaining a performance improvement without an increase in cell size.

Thus it is apparent that there has been provided, in accordance with the invention, an additional storage capacitor which can be added to an SRAM cell without requiring an increase in the cell area, and a method for making the same, that fully meets the needs and advantages set forth previously. Although the invention has been described and illustrated with reference to specific embodiments thereof, is not intended that the invention be limited to these illustrative embodiments. Those skilled in the art will recognize that modifications and variations can be made without departing from the spirit of the invention. For example, it is not essential that a capacitor of the present invention be formed on top of a gate electrode of a bulk MOSFET transistor. Rather the capacitor can be formed solely in a dielectric material, or may be formed in contact with any underlying conductive region, such as a doped substrate region or a conductive layer in a semiconductor device. In addition, the invention is not limited to forming a capacitor in an SRAM cell. For instance, a capacitor may be formed in a dynamic random access memory (DRAM) cell or as a capacitor in another integrated circuit application requiring small packing density. Therefore, it is intended that this invention encompass all such variations and modifications as fall within the scope of the appended claims.

I claim:

1. A semiconductor device having a capacitor structure comprising:

a semiconductor substrate;

a first dielectric layer overlying the semiconductor substrate;

a first conductive layer stacked on the first dielectric layer, wherein the first conductive layer is a constant reference voltage supply layer;

a second dielectric layer stacked on the first conductive layer;

an opening extending through the first dielectric layer, the first conductive layer, and the second conductive layer, the opening having a bottom portion and sidewalls;

conductive spacers formed on the sidewalls of the opening and in electrical contact with the first conductive layer along the sidewalls of the opening;

a third dielectric layer covering the conductive spacers within the opening; and a second conductive layer adjacent the third dielectric layer within the opening;

wherein the first conductive layer and the conductive spacers together form a first electrode of the capacitor structure, the third dielectric layer forms a capacitor dielectric, and the second conductive layer forms a second electrode of the capacitor structure; and wherein the conductive spacers, the third dielectric layer, and the second conductive layer together substantially fill the opening.

2. The semiconductor device of claim 1 further comprising a gate electrode underlying the first dielectric layer, wherein the bottom portion of the opening is defined by a top surface of the gate electrode.

3. The semiconductor device of claim 2 wherein the third dielectric layer has an opening formed therein which exposes the underlying gate electrode, and wherein the second conductive layer is in electrical contact with the gate electrode.

4. The semiconductor device of claim 3 wherein the gate electrode comprises polysilicon.

5. The semiconductor device of claim 4 wherein the gate electrode has a first width and the opening extending through the first dielectric layer, the first conductive layer and the second dielectric layer, has a second width less than the first width, and further comprising a dielectric etch stop layer and a conductive etch step layer overlying the gate electrode which form a capacitive area between the conductive etch stop layer and the gate electrode approximately equal in width to the first width minus the second width.

6. The semiconductor device of claim 5 wherein the dielectric etch stop layer is a nitride anti-reflective coating, and wherein the conductive etch stop layer is polysilicon.

7. A semiconductor device having a capacitor structure comprising:

a semiconductor substrate having a an overlying gate electrode, wherein the gate electrode is comprised of polysilicon;

a first dielectric layer overlying the substrate and the gate electrode;

a first conductive layer overlying the first dielectric layer and being connected to a constant reference voltage supply;

a second dielectric layer overlying the first conductive layer;

an opening formed through the first dielectric layer, the first conductive layer, and the second dielectric layer to expose the gate electrode, wherein the opening has sidewalls and a first bottom portion defined by the gate electrode;

conductive spacers formed along sidewalls of the opening and in electrical contact with the first conductive layer along the sidewalls of the opening;

a capacitor dielectric isolating the conductive spacers; and a second conductive layer overlying the capacitor dielectric and in electrical contact with the gate electrode;

wherein the first conductive layer and the conductive spacers together form a first electrode of the capacitor structure and the second conductive layer forms a second electrode of the capacitor structure.

8. The device of claim 7 further comprising a third dielectric layer formed between the conductive spacers and the gate electrode and wherein the opening has a second bottom portion defined by the third dielectric layer.

9. The device of claim 7 wherein the first and second conductive layers and the conductive spacers are each comprised of polysilicon.

10. The device of claim 7 wherein the capacitor dielectric substantially conforms to the conductive spacers and wherein the second conductive layer substantially fills the remaining space of the opening.

* * * * *

UNITED STATES PATENT AND TRADEMARK OFFICE
CERTIFICATE OF CORRECTION

PATENT NO. : 5,498,889
DATED : March 12, 1996
INVENTOR(S) : James D. Hayden

It is certified that error appears in the above-indentified patent and that said Letters Patent is hereby corrected as shown below:

In Col. 7, Line 14 (Claim 1, Line 12), after "second" change "conductive" to --dielectric--.

Signed and Sealed this

Twenty-fourth Day of June, 1997

*Attest:*

BRUCE LEHMAN

*Attesting Officer*    *Commissioner of Patents and Trademarks*